United States Patent
Chou et al.

(10) Patent No.: US 6,177,843 B1
(45) Date of Patent: Jan. 23, 2001

(54) OSCILLATOR CIRCUIT CONTROLLED BY PROGRAMMABLE LOGIC

(75) Inventors: Richard Chou, Palo Alto; Pidugu L. Narayana, Sunnyvale; Paul H. Scott, San Jose, all of CA (US)

(73) Assignee: Cypress Semiconductor Corp., San Jose, CA (US)

( * ) Notice: Under 35 U.S.C. 154(b), the term of this patent shall be extended for 0 days.

(21) Appl. No.: 09/320,057

(22) Filed: May 26, 1999

(51) Int. Cl.[7] .................... H03L 7/08; H03L 7/095
(52) U.S. Cl. .................... 331/25; 331/1 A; 331/16; 331/DIG. 2; 327/156; 327/159
(58) Field of Search ................... 331/1 A, 10, 11, 331/16, 17, 18, 25, DIG. 2; 327/2–12, 39–49, 156–159

(56) References Cited

U.S. PATENT DOCUMENTS

| 4,646,031 | 2/1987 | Fast et al. ................... 331/1 A |
| 4,943,788 | * 7/1990 | Laws et al. ................... 331/11 |
| 4,996,444 | 2/1991 | Thomas et al. ................... 307/269 |
| 5,138,281 | 8/1992 | Boudewijns ................... 331/1 A |
| 5,254,955 | 10/1993 | Saeki et al. ................... 328/155 |
| 5,406,592 | 4/1995 | Baumert ................... 375/376 |
| 5,629,651 | * 5/1997 | Mizuno ................... 331/34 |
| 5,694,087 | 12/1997 | Ferraiolo et al. ................... 331/11 |
| 5,699,020 | * 12/1997 | Jefferson ................... 331/17 |

\* cited by examiner

Primary Examiner—David Mis
(74) Attorney, Agent, or Firm—Christopher P. Maiorana, P.C.

(57) ABSTRACT

An apparatus comprising an oscillator circuit and a logic circuit. The oscillator circuit may be configured to present an output signal having a frequency in response to (i) a reference signal, (ii) a control signal and (iii) the output signal. The logic circuit may be configured to present the control signal in response to (i) the output signal and (ii) the reference signal. In one example, the logic circuit may disable the oscillator when the output signal oscillates outside a predetermined range.

11 Claims, 6 Drawing Sheets

OSCILLATOR CIRCUIT CONTROLLED BY PROGRAMMABLE LOGIC

FIELD OF THE INVENTION

The present invention relates to a oscillators generally and, more particularly, to a method, architecture, and circuit for controlling and/or operating an oscillator.

BACKGROUND OF THE INVENTION

Referring to FIG. 1, an example of a conventional phase locked loop circuit 10 is shown. The circuit 10 generally comprises phase frequency detector 12, a charge pump/filter 14, a clamp 15, an oscillator 16 and a divider 18. The circuit 10 is used to multiply a reference signal REFCLK having a fixed frequency, received at an input 24, by some multiple set by the divider 18. The phase frequency detector 12 is coupled to the oscillator 16 through the charge pump/filter 14. The divider circuit 18 has an input 28 that receives a feedback of the signal VCO_OUT presented at an output 29 of the oscillator 16. The divider 18 presents a signal to the input 30 of the phase frequency detector 12. The phase frequency detector 12 is capable of indicating both phase error and frequency error. Errors coupled through the charge pump/filter 14 cause the VCO 16 to change the frequency of the signal VCO_OUT to minimize the error. VCO frequency errors may be managed by the circuit 10. The nominal frequency of operation of the signal VCO_OUT will be the frequency of the reference signal REFCLK multiplied by the divider ratio. A typical phase frequency detector 12, as used in the circuit 10, cannot tolerate irregular input data streams that may be found in a serial data input. As a result, the circuit 10 may not be an adequate solution for the VCO frequency error problem. The circuit uses an analog clamp 15, which is difficult to optimize across a wide range of frequencies at the output. Also, the voltages presented by the clamp 15 are difficult to control.

SUMMARY OF THE INVENTION

The present invention concerns an apparatus comprising an oscillator circuit and a logic circuit. The oscillator circuit may be configured to present an output signal having a frequency in response to (i) a reference signal, (ii) a control signal and (iii) the output signal. The logic circuit may be configured to present the control signal in response to (i) the output signal and (ii) the reference signal. In one example, the logic circuit may disable the oscillator when the output signal oscillates outside a predetermined range.

The objects, features and advantages of the present invention include providing a circuit, architecture and/or method for controlling and/or operating an oscillator that may (i) prevent a runaway condition, (ii) use logic to sample the frequency difference between two clocks to compare with programmed thresholds to generate a control signal, (iii) provide a circuit with an adjustable granularity and/or (iv) may provide an auto-clearing mechanism.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 2:
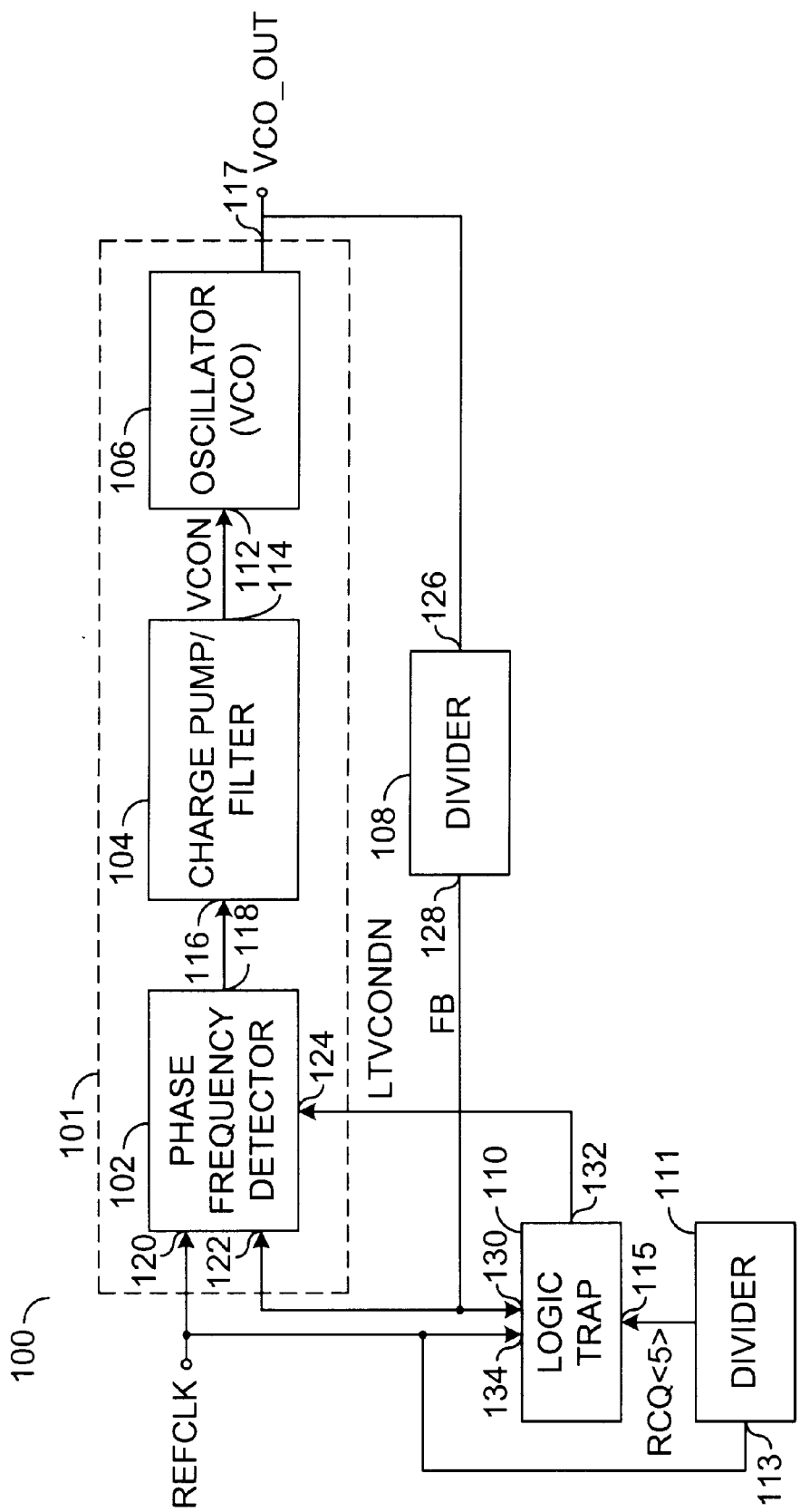
FIG. 2 is a block diagram of a preferred embodiment of the present invention.

Referring to FIG. 2, a block diagram of a circuit 100 is shown in accordance with a preferred embodiment of the present invention. The circuit 100 generally comprises an oscillator block (or circuit) 101, a divider block (or circuit) 108, a logic trap block (or circuit) 110 and a divider block (or circuit) 111. The oscillator circuit 101 generally comprises a phase frequency detector (PFD) 102, a charge pump/filter block (or circuit) 104 and an oscillator 106. In one example, the oscillator 101 may be implemented as a phase-locked loop (PLL). The oscillator 106 may be implemented as a voltage controlled oscillator (VCO). The oscillator 106 generally presents a signal (e.g., VCO_OUT) at an output 117 in response to a signal (e.g., a VCO control voltage VCON) received at an input 112. The charge pump/filter circuit 104 generally presents the signal VCON at an output 114 in response to a signal received at an input 116. The phase frequency detector 102 generally presents a signal at an output 118 in response to a signal received at an input 120, a signal (e.g., FB) received at an input 122 and a signal (e.g., LTVCONDN) received at an input 124. The signal received at the input 120 may be a reference signal having a particular frequency (e.g., REFCLK). The divider circuit 108 generally has an input 126 that may receive the signal VCO_OUT and may present the signal FB at an output 128. The signal FB may be presented to the input 122 of the phase frequency detector 102 as well as to an input 130 of the logic trap 110. The logic trap 110 may also comprise an output 132 that may be present the signal LTVCONDN the input 124 of the phase frequency detector 102, an input 134 that may receive the signal REFCLK and a input 115 that may receive a signal (e.g., RCQ<5>) from the divider 111. The divider 111 may present the signal RCQ<5> in response to the signal REFCLK received at an input 113.

The logic trap 110 generally samples the frequency difference between the signal FB and the signal REFCLK. The frequency difference is generally compared to a number of programmed thresholds to generate the control signal LTVCONDN that is generally presented to the input 124 of the phase detector 102. As a result, the signal LTVCONDN may prevent the VCO 106 from "running" away by maintaining the frequency of oscillation of the signal VCO_OUT within a number of predefined criteria that may avoid the runaway condition. Additionally, digital divide counters internal to the logic trap 110 be kept within a predefined criteria by controlling the signal LTVCONDN (to be described in more detail in connection with FIGS. 3 and 4). In one example, the logic trap 110 may use a 6-bit VCO counter, which may provide a tunable granularity of approximately 6 MHz in a frequency ratio range from 0.06–2. However, additional bit-width counters may be implemented accordingly to meet the design criteria of a particular implementation. Additionally, the logic trap 110 may provide an auto-clearing mechanism (e.g., a reset of the VCO 106 may be provided in the event the VCO begins to runaway).

Figure 3:
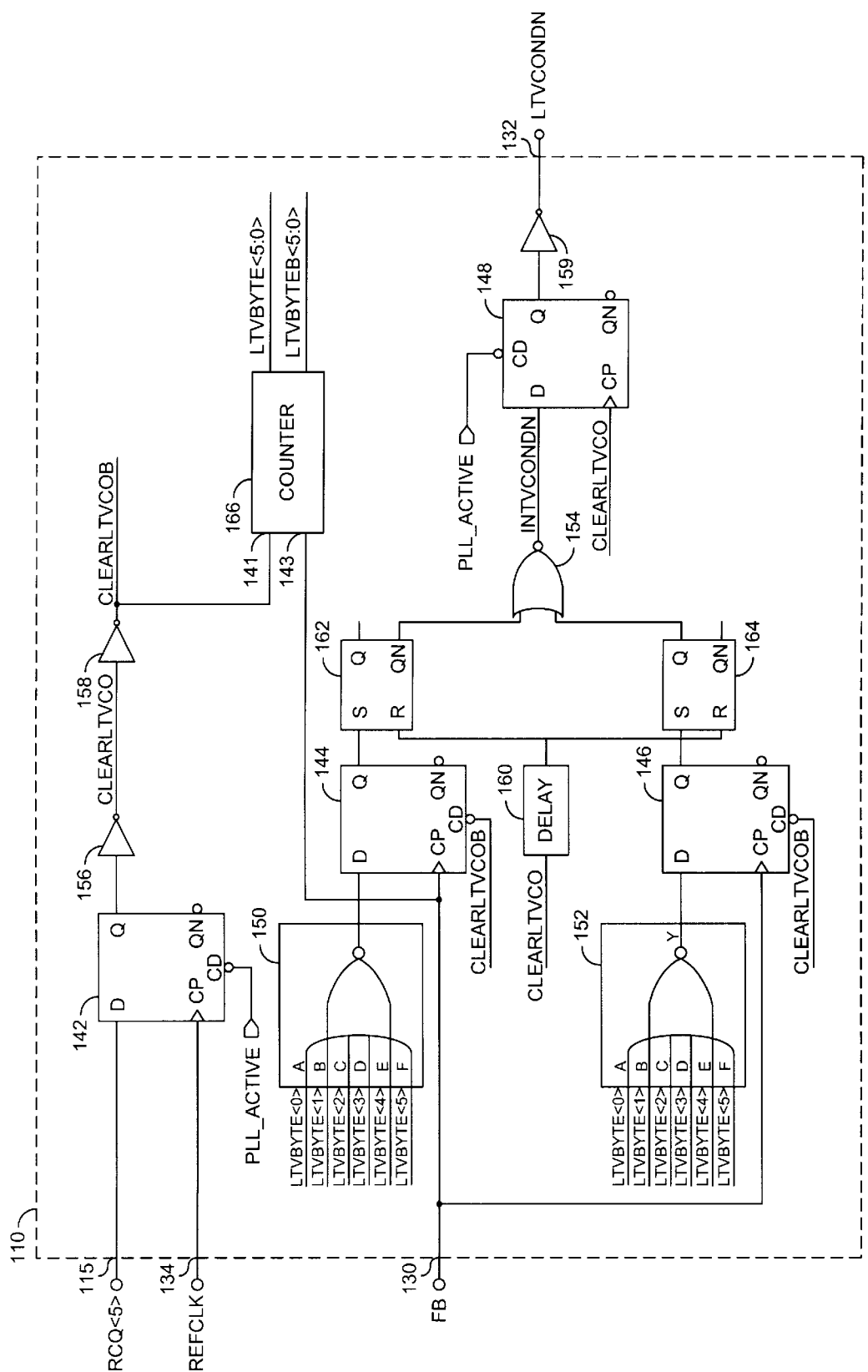
FIG. 3 is a circuit diagram of the logic trap of FIG. 2.

Referring to FIG. 3, a circuit diagram illustrating an example of the logic trap 110 is shown. The logic trap 110 generally comprises a flip-flop 142, a flip-flop 144, a flip-flop 146, a flip-flop 148, a decoder 150, a decoder 152, a gate 154, an inverter 156, an inverter 158, an inverter 159, a delay block (or circuit) 160, a latch block (or circuit) 162, a latch block (or circuit) 164 and a counter block (or circuit) 166. The flip-flops 142, 144, 146 and 148 may be implemented, in one example, as D-type flip-flops. In another example, the flip-flops 142, 144, 146 and 148 may be implemented as T-type flip-flops. In one example, the decoder 150, the decoder 152 and the gate 154 may be implemented as NOR gates. In one example, the latch circuits 162 and 164 may be implemented as set-reset (SR) latches.

The flip-flop 142 and the flip-flop 148 may each receive a signal (e.g., PLL_ACTIVE) at a control input (e.g., CD). The flip-flops 144 and 146 generally receive a signal (e.g., CLEARLTVCOB) at a control input (e.g., CD). The flip-flop 142 generally receives the signal REFCLK at a clock input (e.g., CP) and the signal RCQ<5> at a D input. In one example, the signal RCQ<5>, may be one bit of the six bit signal RCQ<5:0> generated by the divider 111. An output Q of the flip-flop 142 is generally presented to the inverter 156, which may present the signal CLEARLTVCO that may be used to reset the circuit 100. The inverter 158 generally presents a complement (e.g., CLEARLTVCOB) of the signal CLEARLTVCO. The decoder 150 generally receives the six bits (e.g., <0:5>) of the signal LTVBYTE and presents a signal to the D input of the flip-flop 144. A clock input of the flip-flop 144 generally receives the signal FB (that may be a byte clock). The flip-flop 144 generally presents a signal at the output Q that may be presented to the set input (e.g., S) of the SR latch 162. The flip-flop 146 may have a similar configuration as the flip-flop 144. Specifically, the flip-flop 146 may have a D input that may receive a signal from the decoder 152, a clock input that may receive the signal FB, and a Q output that may present a signal to the set input of the set-reset latch 164. The delay 160 generally presents a signal to the reset input (e.g., R) of the SR latches 162 and 164 in response to the signal CLEARTVCO. In one example, the delay 160 may be a programmable delay.

The QN output of the latch 162 and the Q output of the latch 164 are generally presented to the gate 154. The gate 154 generally presents a signal (e.g., INTLTVCONDNB) to the D input of the flip-flop 148. The flip-flop 148 generally comprises (i) a clock input that may receive the signal CLEARTVCO, (ii) a control input that may receive the signal PLL_ACTIVE, and/or (iii) a Q output that may present a signal to the inverter 159. The inverter 159 generally presents the signal LTVCONDN. The signal LTVCONDN is generally an active high signal. However, an additional number of inverters at the Q output of the flip-flop 148 may be implemented to provide an active low signal LTVCONDN.

The counter 166 generally has an input 141 that may receive the signal CLEARTVCOB, an input 143 that may receive the signal FB, an output that may present the signal LTVBYTE<5:0> and a complement signal LTVBYTEV<5:0>.

Figure 4:
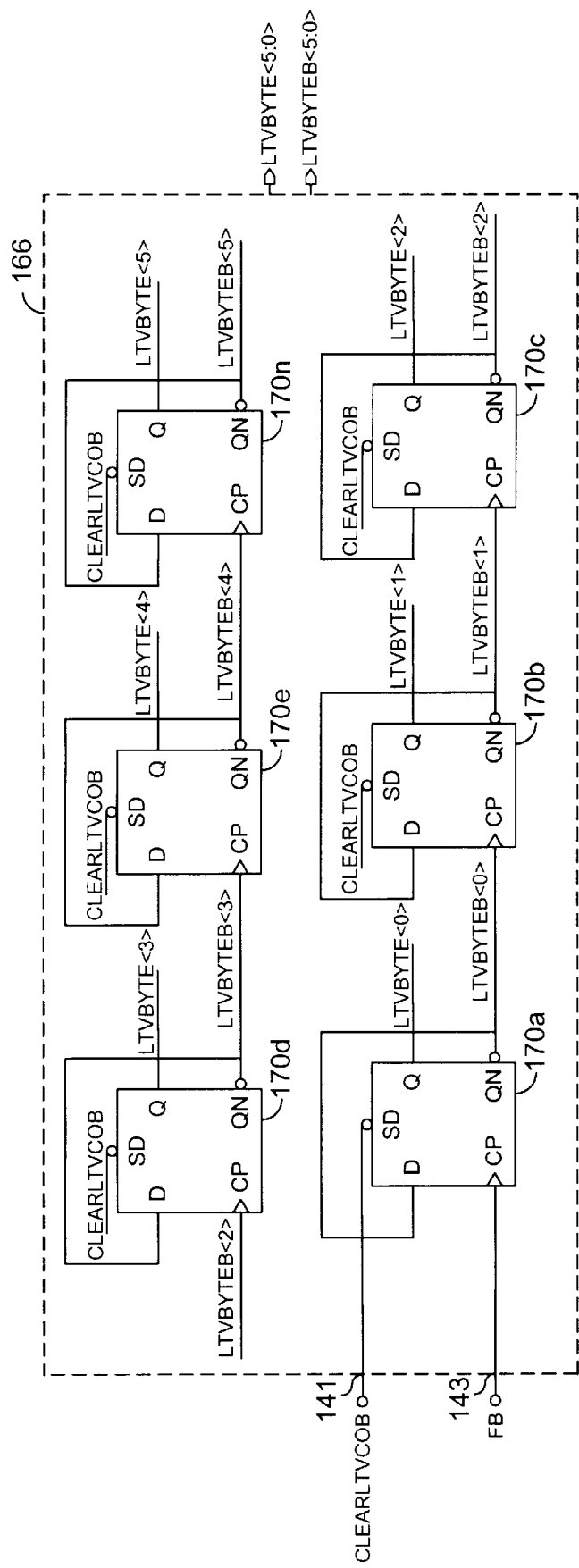
FIG. 4 is a circuit diagram of the VCO of FIG. 2.

Referring to FIG. 4, a diagram of the counter 166 is shown. The VCO counter 166 generally comprises a number of flip-flops 170a–170n. In one example, the flip-flops 170a–170n may be implemented as D-type flip-flops. In another example, the flip-flops 170a–170n may be implemented as T-type flip-flops. The flip-flop 170a generally presents the first bit (e.g., <0>) of the signal. Similarly, the flip-flop 170b generally presents the second bit (e.g., <1>), the flip-flop 170c generally presents the third bit (e.g., <2>), the flip-flop 170d generally presents the fourth bit (e.g., <3>), the flip-flop 170e generally presents the fifth bit (e.g., <4>) and the flip-flip 170n generally presents the sixth bit (e.g., <5>) of the signal LTVBYTE<5:0>. The clock input of the flip-flop 170a generally receives the signal FB. The clock input of each of the successive flip-flops 170b–170n generally receives the QN output of the previous flip-flop. For example, the clock input of the flip-flop 170b generally receives the QN output (e.g., LTVBYTEB<0>) as a clock input. Each of the flip-flops 170b–170n generally receives the signal CLEARLTVCOB at the control input.

Figure 1:
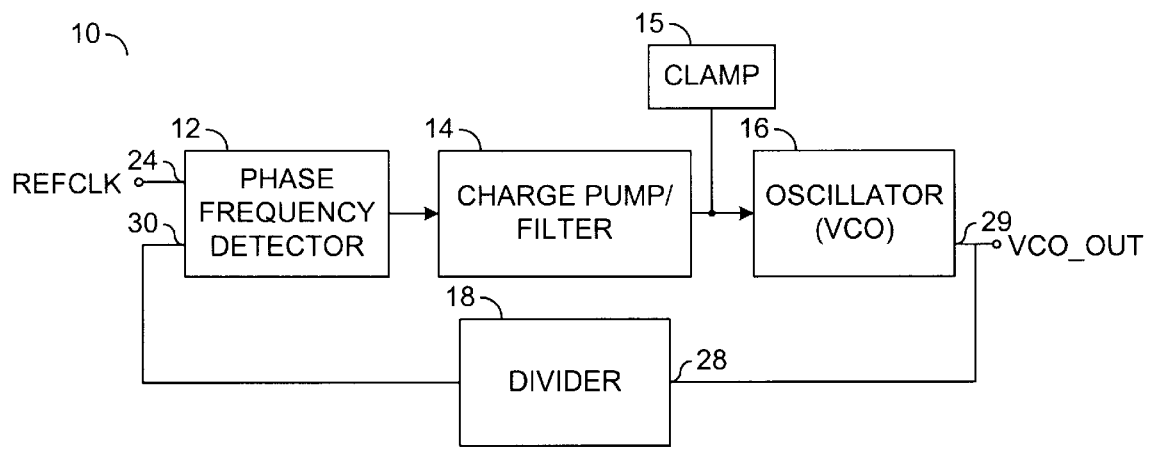
FIG. 1 is a block diagram of a conventional oscillator.
Figure 5:
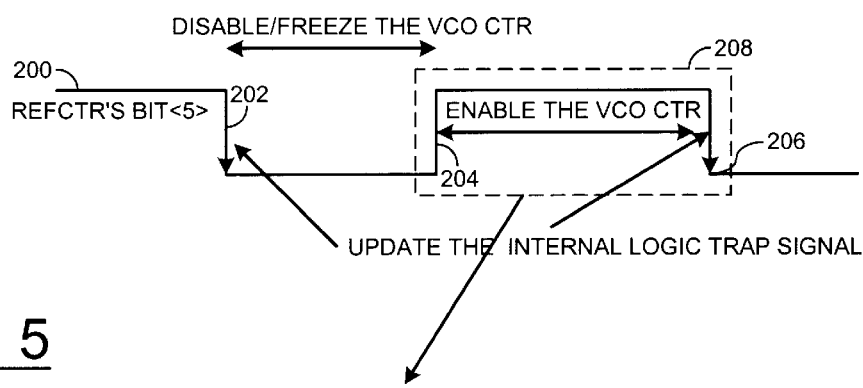
FIG. 5 is a waveform illustrating the operation of the logic trap.

Referring to FIG. 5, a timing diagram illustrating the operation of the logic trap is shown. The waveform 200 generally represents the signal RCQ<5>. When the signal RCQ<5> has a negative transition 202, the VCO counter 166 is generally disabled, or frozen, until a positive transition 204 of the signal RCQ<5>. After the positive transition 204, the VCO counter 166 begins to operate, and remains in operation, until the next subsequent negative transition 206 of the signal RCQ<5>. A box 208 is shown around the positive transition 204 and the negative transition 206 of the signal RCQ<5>, which is shown in more detail in connection with FIG. 6. In general, a logic trap 110 is updated on each negative transition (e.g., 202 and 206) of the signal RCQ<5>.

Figure 6:
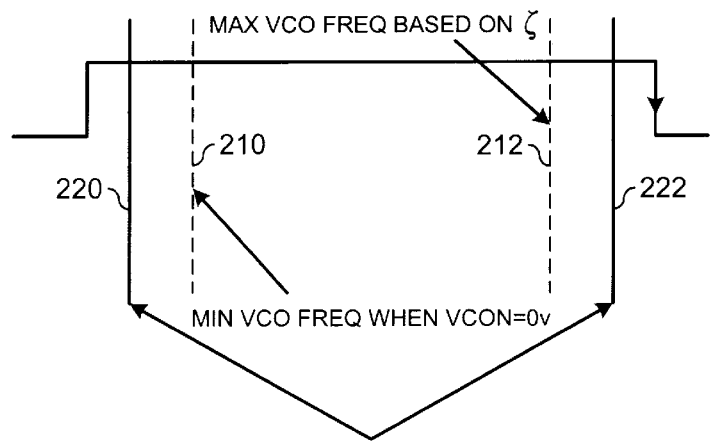
FIG. 6 is a waveform illustrating the function of the logic trap.

Referring to FIG. 6, a more detailed diagram of the portion of the signal RCQ<5> inside the box 208 is shown. A minimum and maximum operating range of the VCO 106 is generally illustrated between a vertical line 210 and a vertical line 212.

A minimum and maximum operating range of the logic trap 110 is generally illustrated between a vertical line 220 and a vertical line 222. In general, if the operating frequency of the VCO 106 moves outside the range defined by the vertical lines 220 and 222, the logic trap 110 generally disables the phase frequency detector 102 which in turn discharges the signal VCON until the VCO 106 continues to operate within the frequency window defined by the vertical line 220 and 222.

The logic trap 110 generally compares the signal REFCLK, which may be derived from an external oscillator, with the signal VCO_OUT. The logic trap 110 may determine if the VCO 106 is running so fast that the signal VCO_OUT cannot toggle, which may prevent the oscillator 101 from ever reducing the voltage of the signal VCON. Such a condition may be referred to as a runaway condition. During power up, if the VCO control voltage VCON starts at VCC, the VCO 106 is generally configured to run as fast as possible, which is generally faster than the VCO 106 can toggle consistently. This may generate the signal VCO_OUT that is effectively running at a lower frequency. In the worst case, the signal VCO_OUT will not toggle at all (e.g., frequency=0) which tells the PFD 102 and the charge pump/filter 104 that the loop is running too slow, when the loop may be running too fast. The PFD 102 and the charge pump/filter 104 may then try to increase the VCO control voltage VCON incorrectly, thinking that the loop is running too fast. Such a condition generally keeps the oscillator 101 in the runaway state indefinitely. The signal FB will likewise be running at a lower than expected frequency since it is clocked by the signal VCO_OUT.

The logic trap 110 anticipates the runaway condition by comparing the signal REFCLK and the signal FB. Under normal locked conditions, the signal REFCLK and the signal FB will run at the same rate. The logic trap 110 may have two general states of operation. In a first state (e.g., STATE1), a potential runaway condition may occur when the frequency of the signal FB will be much smaller than the frequency of the signal REFCLK. During such a state, the logic trap 110 generally forces the PFD 102 and the charge pump/filter 104 to continually PUMP DOWN (e.g., lower) the VCO control voltage VCON by activating the signal LTVCONDN presented to the input 124. The corresponding frequency of the signal VCO_OUT is illustrated as the leftmost vertical line 220 in FIG. 6. The frequency at the vertical line 220 must generally be less than the lowest frequency the VCO generates when the signal VCON is at 0V (illustrated by the dashed vertical line 210 in FIG. 6).

A second state (e.g., STATE2) may occur when (i) the frequency of the signal FB runs much faster than the frequency of the signal REFCLK and (ii) the signal FB is still toggling consistently. The logic trap 110 may then PUMP DOWN the VCO control voltage VCON by activating the signal LTVCONDN. The corresponding frequency of the signal VCO_OUT is illustrated as the vertical line 222 in FIG. 6. The signal VCO_OUT generally needs to overshoot the PLL lock frequency in order to work properly. The PLL lock frequency is determined by the loop damping factor $\zeta$ and is illustrated by the dashed vertical line 212 in FIG. 6.

The divider 111 may be implemented as a large ripple counter. In one example, the divider 111 may provide a divide by 64 to produce the signal RCQ<5>. The counter 166 may divide the signal FB in a similar fashion. RCQ<5> will generally activate the logic trap 110 every 32 pulses of the signal REFCLK, then deactivate the logic trap 110 for the next 32 pulses of the signal REFCLK, and then repeat the cycle counter 166. This may be accomplished since the flip-flops 144 and 146 may be reset/set by the signals CLEARLTVCO/CLEARLTVCOB which may be activated when the RCQ<5> is in a low state. The signal LTVCONDN, which may be, in one example, an active high signal, may drive the PFD 102. The signal LTVCONDN may be a registered version of the signal INTLTVCONDNB (which is active low) and may be clocked from the signal CLEARTVCO (e.g., whenever logic trap 110 is deactivated).

Starting with a deactivated state, the following is an example of a sequence of events describing the operation of the logic trap 110. However, other particular transitions may be implemented accordingly to meet the design criteria of a particular implementation. When the signal RCQ<5>=0 is clocked, the counter 166 is set to a first value (e.g., 3F). The signal CLEARTVCO may force the signal INTLTV-CONDNB active thru the delay 160, the latch 162, the latch 164 and the gate 154.

After the signal RCQ<5>=1 is clocked, the counter 166 and the flip-flops 144, 146 and 148 may no longer reset. Again, the signal INTLTVCONDNB generally starts off in an active state.

The counter 166 starts counting up after each cycle of the signal FB starting from 3F, (e.g., 3F-00- 01-02- . . . 3E-3F-00- . . . ) as long as the signal RCQ<5> has remained high, which generally lasts for 32 cycles of the signal REF_CLK. State S1 is 00 and state S2 is 3E.

If the signal FB clocks less than twice after 32 cycles of the signal REFCLK, the signal INTLTVCONDNB will remain active, generally indicating that the VCO 106 is toggling slower than the minimum threshold indicated by line 220 in FIG. 6.

If the signal FB clocks 2 or more times, but less than 65 times, after 32 cycles of the signal REFCLK, the state S1 (00) would be decoded and latched after the second clock of the signal FB and will generally remain latched. This may set the signal INTLTVCONDNB to an inactive state since the inputs to the gate 154 are both low. This generally indicates that the VCO 106 is toggling at a correct rate indicated by the region between the lines 220 and 222 in FIG. 6.

If the signal FB clocks more than 65 times after 32 cycles of the signal REFCLK, the state S2 (3E) would be decoded and latched after the $65^{th}$ clock of the signal FB and remain latched. This generally sets the signal INTLTVCONDNB to an active state. This condition generally indicates that the VCO 106 is toggling at faster rate than the rate indicated by the line 222 in FIG. 6.

After the signal RCQ<5>=0 is clocked, the logic trap 110 is generally inactive and the signal INTLTVCONDNB is propagated to the PFD 102 and is generally held for 32 cycles of the signal REFCLK. If the signal LTVCONDN is active, the PFD 102 will generally pump down the signal VCON for 32 REFCLK cycles. The method may repeat from the step where the signal RCQ<5>=1 is clocked. If the signal VCO_OUT is not within the specified frequency limits of FIG. 6, the signal LTVCONDN will remain active. The logic trap 110 will generally determine whether to inactivate the signal LTVCONDN every 64 REFCLK cycles.

Figure 7A:
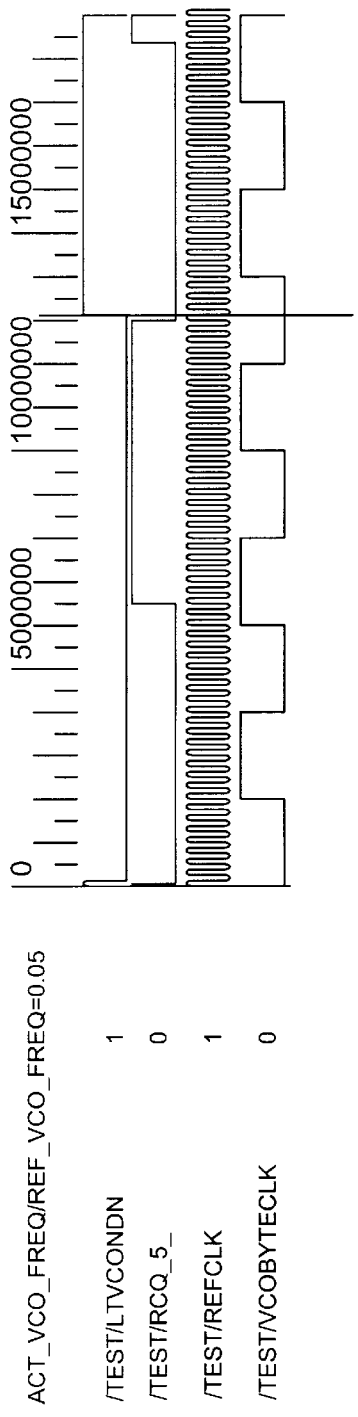
FIGS. 7A and 7B are simulations of various waveforms of the present invention.
Figure 7B:
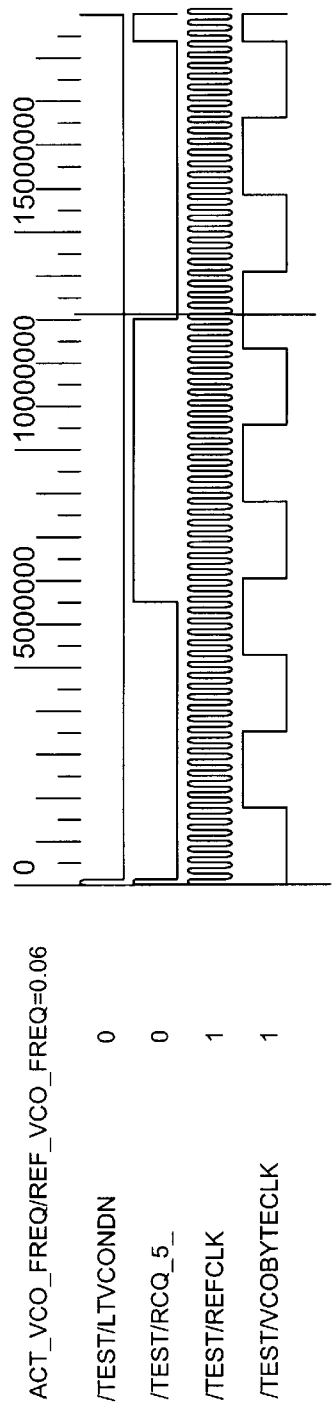
Figure 8A:
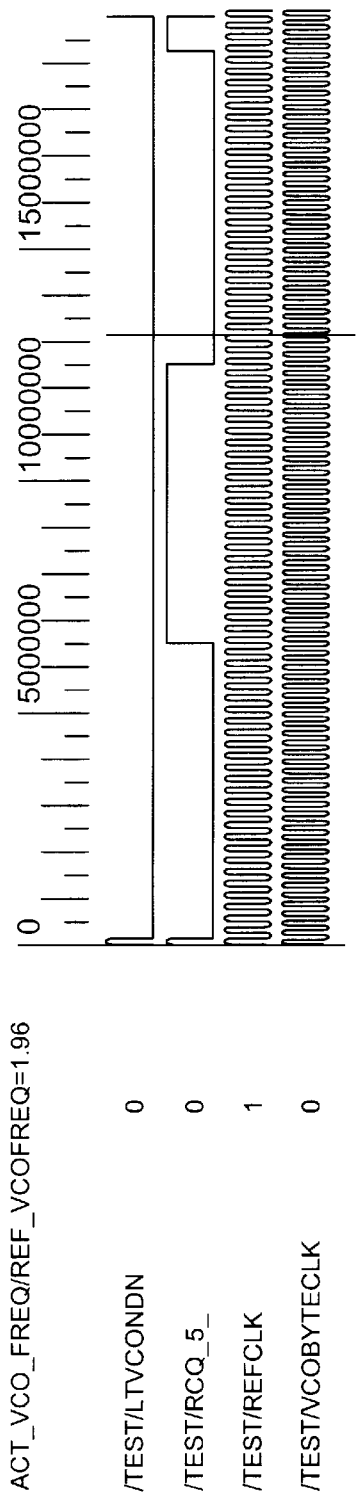
FIGS. 8A and 8B are simulations of various waveforms of the present invention.
Figure 8B:
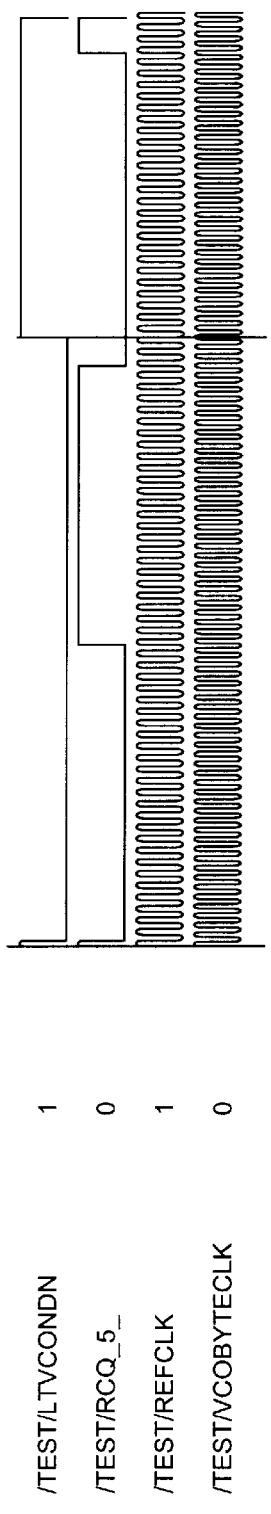

FIGS. 7a and 7b illustrate the logic trap 110 activating and staying inactive below and above the lower frequency limit respectively. FIGS. 8a and 8b illustrate the logic trap 110 staying inactive and activating below and above the upper frequency limit respectively.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   an oscillator circuit configured to present an output signal having a frequency in response to (i) a reference signal, (ii) a control signal and (iii) said output signal; and
   a logic circuit configured to present said control signal to a phase frequency detector in response to (i) said output signal and (ii) said reference signal.

2. The apparatus according to claim 1, further comprising a divider circuit configured to divide said output signal before said output signal is presented to said oscillator circuit and said logic circuit.

3. The apparatus according to claim 1, wherein said oscillator circuit comprises:
   a voltage controlled oscillator (VCO); and
   said phase frequency detector.

4. The apparatus according to claim 3, wherein said oscillator further comprises a charge pump circuit and a filter circuit configured between said phase frequency detector and said voltage controlled oscillator.

5. The apparatus according to claim 1, wherein said logic circuit comprises a plurality of memory elements.

6. The apparatus according to claim 5, wherein said logic circuit further comprises a VCO counter.

7. The apparatus according to claim 6, wherein said logic circuit disables said VCO counter when said output signal oscillates outside of a predetermined range.

8. The apparatus according to claim 7, wherein said predetermined range is programmable.

9. The apparatus according to claim 8, wherein said control signal is generated by comparing the difference between the reference signal and the output signal to a program threshold.

10. An apparatus comprising:
  means for generating an output signal having a frequency in response to (i) a reference signal, (ii) a control signal and (iii) said output signal; and
  means for generating said control signal presented to a phase frequency detector in response to (i) said output signal and (ii) said reference signal.

11. A method for controlling an oscillator comprising the steps of:
  (A) generating an output signal having a frequency in response to (i) a reference signal, (ii) a control signal and (iii) said output signal; and
  (B) generating said control signal presented to a phase frequency detector in response to (i) said output signal and (ii) said reference signal.

* * * * *